(12) United States Patent
Wu et al.

(10) Patent No.: US 10,991,586 B2
(45) Date of Patent: *Apr. 27, 2021

(54) IN-SITU TUNGSTEN DEPOSITION WITHOUT BARRIER LAYER

(71) Applicant: Applied Materials, Inc., Santa Clara, CA (US)

(72) Inventors: Yong Wu, Sunnyvale, CA (US); Wei V. Tang, Santa Clara, CA (US); Jianqiu Guo, San Jose, CA (US); Wenyi Liu, Santa Clara, CA (US); Yixiong Yang, Fremont, CA (US); Jacqueline S. Wrench, San Jose, CA (US); Mandyam Sriram, San Jose, CA (US); Srinivas Gandikota, Santa Clara, CA (US); Yumin He, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/835,279

(22) Filed: Mar. 30, 2020

(65) Prior Publication Data

US 2020/0243341 A1   Jul. 30, 2020

Related U.S. Application Data

(63) Continuation-in-part of application No. 16/588,235, filed on Sep. 30, 2019, which is a continuation of
(Continued)

(51) Int. Cl.
*H01L 21/285* (2006.01)
*H01L 21/768* (2006.01)
(Continued)

(52) U.S. Cl.
CPC .... *H01L 21/28568* (2013.01); *H01L 21/0262* (2013.01); *H01L 21/02532* (2013.01);
(Continued)

(58) Field of Classification Search
CPC ... H01L 21/02; H01L 21/025; H01L 21/0259; H01L 21/02592; H01L 21/026;
(Continued)

(56) References Cited

U.S. PATENT DOCUMENTS

| 5,227,329 A | 7/1993 | Kobayashi et al. |
| 5,789,030 A | 8/1998 | Rolfson |

(Continued)

FOREIGN PATENT DOCUMENTS

| CN | 102959712 A | 3/2013 |
| WO | 00/06795 A1 | 2/2000 |
| WO | 2007075369 A1 | 7/2007 |

OTHER PUBLICATIONS

Non-Final Office Action in U.S. Appl. No. 16/588,235, dated Apr. 10, 2020, 10 pages.
(Continued)

*Primary Examiner* — Monica D Harrison
(74) *Attorney, Agent, or Firm* — Servilla Whitney LLC

(57) ABSTRACT

In-situ methods for depositing a metal film without the use of a barrier layer are disclosed. Some embodiments comprise forming an amorphous nucleation layer comprising one or more of silicon or boron and forming a metal layer on the nucleation layer. These processes are performed without an air break between processes.

20 Claims, 7 Drawing Sheets

Related U.S. Application Data application No. 15/961,363, filed on Apr. 24, 2018, now Pat. No. 10,468,263, which is a continuation-in-part of application No. 15/381,752, filed on Dec. 16, 2016, now Pat. No. 9,978,685.

(60) Provisional application No. 62/269,974, filed on Dec. 19, 2015, provisional application No. 62/569,883, filed on Oct. 9, 2017.

(51) Int. Cl.
  *H01L 21/3205* (2006.01)
  *H01L 21/02* (2006.01)

(52) U.S. Cl.
  CPC .. *H01L 21/02592* (2013.01); *H01L 21/02664* (2013.01); *H01L 21/28518* (2013.01); *H01L 21/28556* (2013.01); *H01L 21/28562* (2013.01); *H01L 21/32051* (2013.01); *H01L 21/76843* (2013.01); *H01L 21/76876* (2013.01); *H01L 21/76877* (2013.01)

(58) Field of Classification Search
  CPC ........... H01L 21/0266; H01L 21/02664; H01L 21/28; H01L 21/285; H01L 21/2851; H01L 21/2855; H01L 21/28556; H01L 21/2856; H01L 21/28562; H01L 21/32; H01L 21/32; H01L 21/3205; H01L 21/32051; H01L 21/76; H01L 21/768; H01L 21/7684; H01L 21/76843; H01L 21/76876; H01L 21/7687; H01L 21/46877
  USPC .......................................................... 438/655
  See application file for complete search history.

(56) References Cited

U.S. PATENT DOCUMENTS

| | | | |
|---|---|---|---|
| 6,197,669 | B1 | 3/2001 | Twu |
| 7,405,158 | B2 | 7/2008 | Lai et al. |
| 8,071,478 | B2 | 12/2011 | Wu et al. |
| 8,119,527 | B1 | 2/2012 | Chadrashekar et al. |
| 9,793,139 | B2 | 10/2017 | Sharangpani et al. |
| 10,468,263 | B2 * | 11/2019 | Chen .................. H01L 21/0262 |
| 2006/0128139 | A1 | 6/2006 | Paranjpe et al. |
| 2008/0254623 | A1 | 10/2008 | Chan et al. |
| 2015/0263124 | A1 | 9/2015 | Yamaguchi |
| 2016/0284553 | A1 | 9/2016 | Suzuki et al. |
| 2017/0106660 | A1 | 6/2017 | Chen et al. |
| 2017/0179036 | A1 | 6/2017 | Chen et al. |

OTHER PUBLICATIONS

PCT International Search Report and Written Opinion in PCT/US2018/054932, dated Jan. 31, 2019.
PCT International Search Report and Written Opinion in PCT/US2018/065151, dated Apr. 26, 2019, 14 pages.
Non-Final Office Action in U.S. Appl. No. 16/754,619 dated Feb. 17, 2021, 13 pages.

* cited by examiner

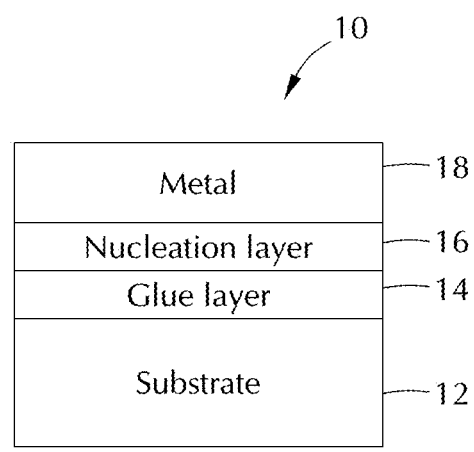
FIG. 1
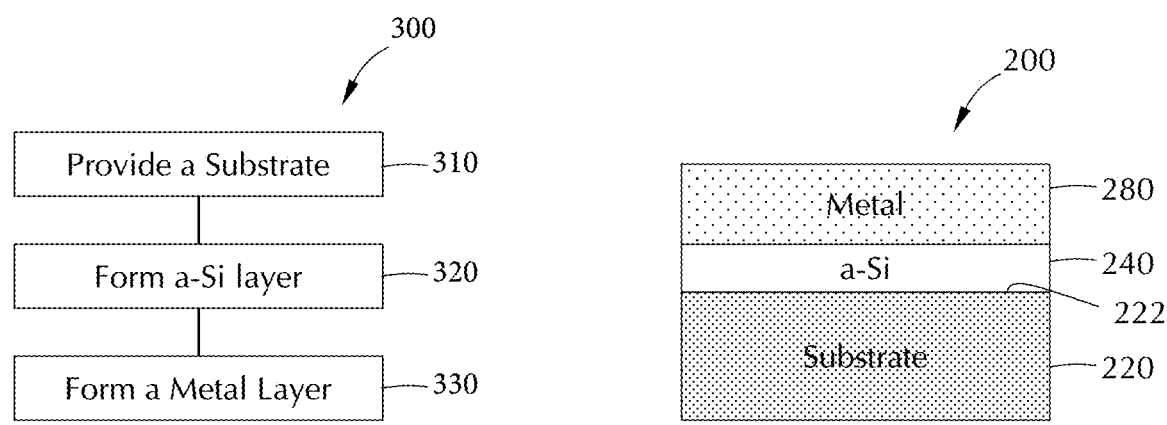
FIG. 2A
FIG. 2B

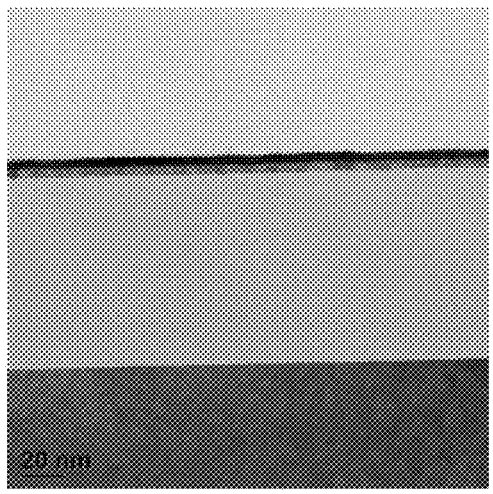 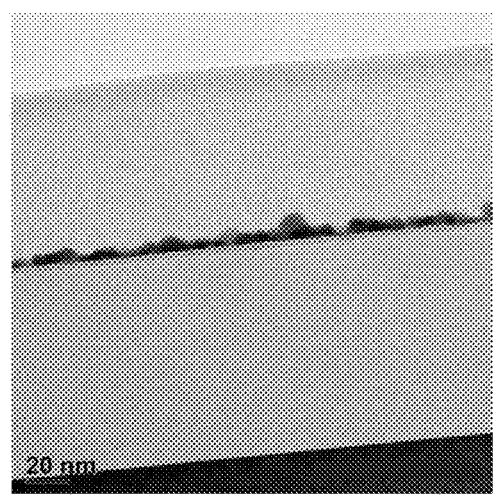
FIG. 11A  FIG. 11B
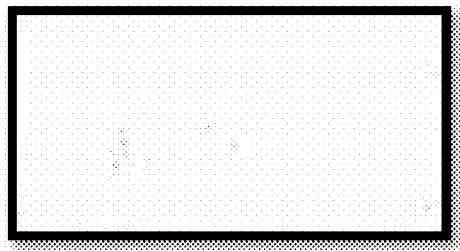 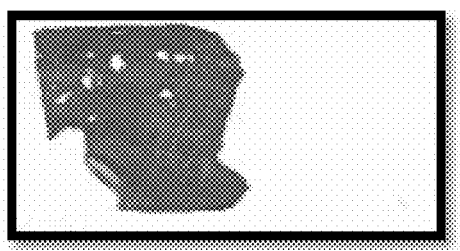
FIG. 11C

IN-SITU TUNGSTEN DEPOSITION WITHOUT BARRIER LAYER

CROSS-REFERENCE TO RELATED APPLICATIONS

This application is a continuation-in-part application of U.S. application Ser. No. 16/588,235, filed Sep. 30, 2019, which is a continuation of U.S. application Ser. No. 15/961,363, filed Apr. 24, 2018, now issued as U.S. Pat. No. 10,468,263, issued on Nov. 5, 2019, which is a continuation-in-part application of U.S. application Ser. No. 15/381,752, filed Dec. 16, 2016, now issued as U.S. Pat. No. 9,978,685, issued on May 22, 2018, which claims priority to U.S. Provisional Application No. 62/269,974, filed Dec. 19, 2015; and U.S. Provisional Application No. 62/569,883, filed Oct. 9, 2017, all of which are incorporated by reference herein in their entirety.

FIELD

The present disclosure generally relates to methods of depositing thin films. In particular, the disclosure relates to methods of depositing tungsten or tungsten-containing films.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow techniques to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

Amorphous silicon is widely used in semiconductor devices, flat-panel displays, and solar cells. There remains a key technical challenge for the development of amorphous silicon deposition process with conformality (i.e., good step coverage) or gap-fill performance in high aspect-ratio features. Conventional LPCVD process is limited to high temperature (>550° C.) and low pressure, and, therefore, exhibits poor step coverage and/or gap-fill performance; PECVD process also does not give good step coverage and/or gap-full performance.

Due to the increasing integration of semiconductor circuitry, tungsten has been used based upon superior step coverage. As a result, deposition of tungsten employing CVD techniques enjoys wide application in semiconductor processing due to the high throughput of the process. Depositing tungsten by conventional CVD methods, however, is attendant with several disadvantages.

For example, ALD processes deposit tungsten films into vias containing high aspect ratios (e.g., 20), whereas conventional CVD processes will usually cause similar vias to "pinch-off" and not completely fill. Additionally, tungsten does not readily adhere to some surfaces (e.g., dielectric spacers or oxides). To increase the adhesion of tungsten to dielectric spacers, conventional processes include a TiN layer. The deposition of the TiN film as a seed layer can be time consuming and adds additional complexity to the overall process.

The atomic layer deposition (ALD) of tungsten thin films exhibits very long incubation delay's on silicon, silicon dioxide and titanium nitride services due to poor nucleation performance. A nucleation layer is usually used to mitigate this issue. Conventionally, ALD $WSi_x$ or $WB_x$ is deposited by $WF_6/Si_2H_6$ and $WF_6/B_2H_6$, respectively. However, $WF_6$ is directly exposed to the substrate surface (e.g., Si, $SiO_2$) and damages the substrate.

Additionally, ALD tungsten films do not stick well directly on silicon or silicon oxide substrate surfaces. A titanium nitride glue layer is used to improve the adhesion. However, both the titanium nitride glue layer and $WSi_x/WB_x$ nucleation layer do not conduct well, resulting in a very high resistivity for the stack ($W/WSi_x/TiN$).

Therefore, there is a need in the art for improved techniques to deposit tungsten layers with decreased resistivity and no barrier/glue layer.

SUMMARY

One or more embodiments of the disclosure are directed to a processing method. The method comprises exposing a substrate surface to a boron precursor to form an amorphous boron layer. The substrate surface is substantially free of a barrier layer. The amorphous boron layer is exposed to a first metal precursor to convert the amorphous boron layer to a first metal layer. A second metal layer is formed on the first metal layer by exposing the first metal layer to a second metal precursor.

Additional embodiments of the disclosure are directed to a processing method. The method comprises exposing a substrate surface to a silicon precursor to form an amorphous silicon layer. The substrate surface is substantially free of a barrier layer. The amorphous silicon layer is exposed to a first metal precursor to convert the amorphous silicon layer to a first metal layer. A second metal layer is formed on the first metal layer by exposing the first metal layer to a second metal precursor.

Further embodiments of the disclosure are directed to a processing method. The method comprises exposing a substrate surface to a silicon precursor and a boron precursor to form an amorphous layer comprising silicon and boron. The substrate surface is substantially free of a barrier layer. The amorphous layer is exposed to a first metal precursor to convert the amorphous layer to a first metal layer. A second metal layer is formed on the first metal layer by exposing the first metal layer to a second metal precursor.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

FIG. 1 shows schematic of a film stack in accordance with one or more embodiment of the disclosure;

FIG. 2A shows a process scheme in accordance with one or more embodiment of the disclosure;

FIG. 2B shows a schematic of a film stack in accordance with the process scheme of FIG. 2A;

FIG. 11A shows a cross-sectional image of a sample prepared in-situ, without an air break, in accordance with one or more embodiment of the disclosure;

FIG. 11B shows a cross-sectional image of a sample prepared ex-situ, with an air break, in accordance with one or more embodiment of the disclosure; and FIG. 11C shows an adhesion test result of a sample prepared in-situ and a sample prepared ex-situ in accordance with one or more embodiment of the disclosure.

DETAILED DESCRIPTION

Figure 3:
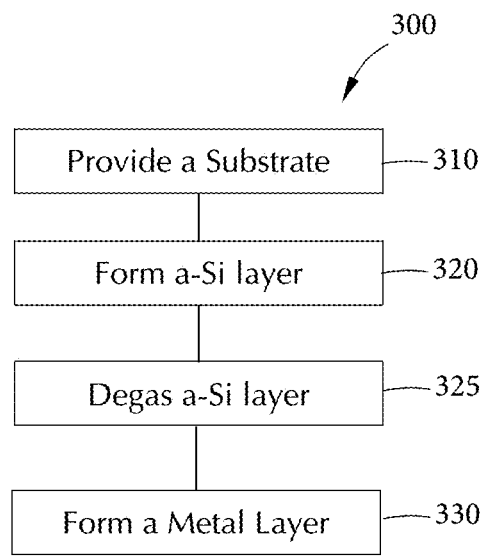
FIG. 3 shows a process scheme in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. A substrate surface may also include dielectric materials such as silicon dioxide and carbon doped silicon oxides. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

One or more embodiments of the disclosure are directed to methods of depositing a conformal amorphous silicon thin film as one or more of a glue layer, a fluorine diffusion barrier and/or a nucleation layer for metal ALD (e.g., tungsten deposition). While tungsten deposition is referred to in many embodiments, those skilled in the art will understand that other metals (e.g., Mo) could be deposited by the disclosed process. The disclosure is not limited to ALD tungsten deposition.

Certain embodiments of the disclosure include process integration schemes for metal ALD processes. For example, tungsten deposited by atomic layer deposition on a silicon substrate. With reference to FIG. 1, a stack 10 may include a substrate 12 (e.g., $SiO_2$) with a glue layer 14 (e.g., TiN), a nucleation layer 16 (e.g., $WSi_x$ and $WB_x$) and a metal 18 (e.g., W). In one or more embodiment of a process scheme, a nucleation layer is replaced with an amorphous silicon layer. In some embodiments, the nucleation layer is replaced with an amorphous silicon layer and the TiN glue layer is made thinner. In one or more embodiments, both the nucleation layer and glue layer are replaced with an amorphous silicon layer.

With reference to FIGS. 2A and 2B, one or more embodiments of the disclosure are directed processing methods 300 and film stacks 200. A substrate 220 having a substrate surface 222 is provided in step 310. In step 320, the substrate 220 exposed to a silicon precursor to form an amorphous silicon layer 240 on the substrate surface 222.

In some embodiments, the amorphous silicon (a-Si) formation can be achieved by maximizing the partial pressure of the silicon precursor while minimizing the wafer temperature. Suitable silicon precursors include, but are not limited to, poly-silanes ($Si_xH_y$). For example, poly-silanes include disilane ($Si_2H_6$), trisilane ($Si_3H_8$), tetrasilane ($Si_4H_{10}$), isotetrasilane, neopentasilane ($Si_5H_{12}$), cyclopentasilane ($Si_5H_{10}$), hexasilane ($C_6H_{14}$), cyclohexasilane ($Si_6H_{12}$) or, in general, $Si_xH_y$ with x=2 or more, and combinations thereof. For example, disilane, which has a moderate processing temperature and high vapor pressure, may be used as the silicon precursor alone or in combination with other species.

In some embodiments, the silicon precursor comprises substantially only disilane. As used in this specification and the appended claims, the phrase "substantially only disilane" means that at least 95% of the active species is disilane. Other gases, such as carrier gases and inert gases, can be included in any amount.

The thickness of the amorphous silicon layer 240 can vary depending on, for example, the substrate surface and subsequent films and processes. In some embodiments, the amorphous silicon layer 240 has a thickness in the range of about 1 Å to about 100 Å. In one or more embodiments, the amorphous silicon layer 240 has a thickness in the range of about 1 Å to about 50 Å, or in the range of about 10 Å to about 40 Å, or in the range of about 30 Å to about 40 Å. In some embodiments, the thickness of the amorphous silicon layer 240 is greater than 0 Å and less than or equal to about 50 Å, 45 Å or 40 Å.

A metal layer 280 is formed on the amorphous silicon layer 240 in step 330. The metal layer 280 can be formed by any suitable technique including, but not limited to, atomic layer deposition (ALD), plasma-enhanced atomic layer deposition (PE-ALD), chemical vapor deposition (CVD), plasma-enhanced chemical vapor deposition (PE-CVD) and physical vapor deposition (PVD).

The metal layer 280 can comprise any suitable metal. In some embodiments, the metal layer 280 comprises one or more of tungsten or molybdenum. In some embodiments, the metal layer 280 consists essentially of tungsten. In some embodiments, the metal layer 280 consists essentially of molybdenum. As used in this regard, "consists essentially of" means that the metal layer 280 is greater than or equal to about 80, 85, 90 or 95 atomic % of the specified component. For example, a metal layer 280 consisting essentially of tungsten has a composition that is greater than or equal to about, for example, 90 atomic % tungsten.

In some embodiments, the metal layer 280 is deposited by CVD. A metal precursor and a reactant may be coflowed into a processing chamber to deposit a layer on the substrate. The precursor and reactant are allowed to react in the gas phase.

In some embodiments, the metal layer 280 is deposited by ALD. In some embodiments, the metal layer 280 is deposited by sequentially exposing the amorphous silicon layer 240 to a metal precursor and a reactant.

The metal precursor can be any suitable precursor that can be used to deposit a metal film. In some embodiments, the metal precursor comprises a metal selected from tungsten, molybdenum and combinations thereof. In one or more embodiments, the metal precursor comprises one or more of $WF_6$ and $MoF_6$. In some embodiments, the metal precursor is a fluorine containing precursor. It is known that fluorine may etch silicon surface. Some embodiments of the disclosure advantageously allow the use of fluorine precursors because the amorphous silicon layer 240 can be formed to a thickness sufficient to ensure that the precursor does not remove all of the a-Si film.

The reactant can be any suitable reactant that is able to react with a species formed on the surface. For example, if $WF_6$ is used as the precursor, there will be $-WF_x$ species on the surface. The reactant is able to react with the $-WF_x$ species to produce a W film.

FIG. 3 shows a process flow for another embodiment of the disclosure in which a degas process 325 is included after formation of the amorphous silicon layer 240. The amorphous silicon layer 240 in some embodiments is exposed to a degas environment to remove outgassed species prior to forming the metal layer 280.

The deposited amorphous silicon layer 240 may evolve or outgas a species, for example, hydrogen. The degas environment provides an opportunity for the gaseous species to evolve, minimizing bubbling of the final film. The degas environment can include any condition with allows or encourages degassing of the film. For example, the degas environment may consists essentially of an inert gas. As used in this regard, "consists essentially of" means that there is no gaseous species that interfere with the outgassing of the deposited film. Other reactive species may be present without inhibiting degassing of the film while still consisting essentially of an inert gas.

Suitable inert gases include, but are not limited to, one or more of argon, helium, nitrogen, and/or mixtures thereof.

In one or more embodiments, the outgassed species comprises hydrogen, $SiH_2$, $SiH_3$, $SiH_4$, and/or other low-order silanes.

The pressure in the processing chamber, or region of the processing chamber can be independently controlled for the precursor exposure and degas environment. In some embodiments, exposure to each of the silicon precursor and the degas environment occurs at a pressure in the range of about 10 mTorr to about 100 Torr. In some embodiments, the silicon precursor is exposed to the substrate at a pressure greater than or equal to about 500 mTorr, or greater than or equal to about 1 Torr, or greater than or equal to about 5 Torr, or greater than or equal to about 10 Torr, or greater than or equal to about 20 Torr, or greater than or equal to about 30 Torr.

The temperature at which the substrate surface is exposed to the precursor or degas environment can be varied depending on, for example, the thermal budget of the device being formed and the precursor. In some embodiments, exposure to each of the precursor and the degas environment occurs at a temperature in the range of about 100° C. to about 700° C. In one or more embodiments, the silicon halide precursor is exposed to the substrate at a temperature in the range of about 250° C. to about 600° C., or in the range of about 400° C. to about 550° C.

The thickness of the a-Si film formed with the silicon precursor before exposure to the degas environment can be modified. In some embodiments, each exposure to the silicon precursor and the degas environment grows a film with a thickness in the range of about 5 Å to about 20 Å.

The precursor and degas environments can be repeatedly sequentially exposed to the substrate surface to form a film with a predetermined thickness. In some embodiments, the amorphous silicon film has a total thickness in the range of about 100 Å to about 1 µm.

In some embodiments, a-Si is deposited by disilane at a wafer temperature less than about 450° C., and disilane partial pressure is greater than or equal to about 20 Torr. In an exemplary embodiment, the substrate is exposed to the silicon precursor at a pressure greater than or equal to about 20 Torr at a temperature in the range of about 400° C. to about 550° C.

Figures 4A, 4B:
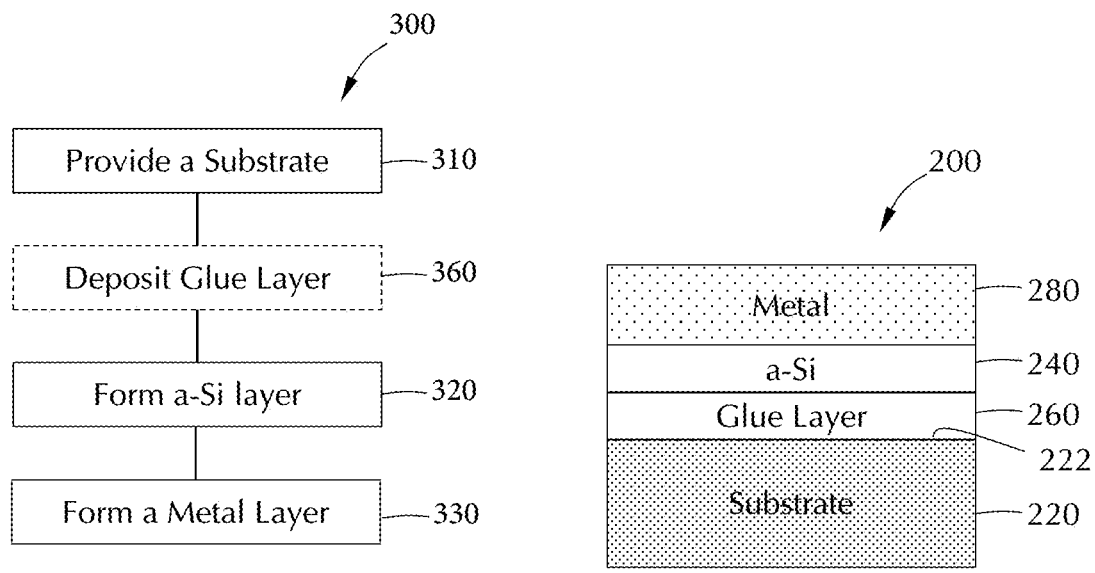
FIG. 4A shows a process scheme in accordance with one or more embodiment of the disclosure.
FIG. 4B shows a schematic of a film stack in accordance with the process scheme of FIG. 4A.

Referring to FIGS. 4A and 4B, some embodiments of the disclosure further comprise step 360 in which a glue layer 260 is deposited on the substrate before forming the amorphous silicon layer 240. The glue layer 260 is a layer that the amorphous silicon can stick to with less likelihood of peeling than if the amorphous silicon layer was deposited directly onto the substrate 220. In some embodiments, the glue layer comprises TiN. In one or more embodiments, the substrate 220 has a silicon oxide surface and the glue layer comprises TiN.

The thickness of the glue layer 260 can vary depending on the substrate and the thickness of amorphous silicon to be deposited. In some embodiments, the glue layer 260 has a thickness in the range of about 1 Å to about 30 Å, or in the range of about 5 Å to about 30 Å. In some embodiments, the glue layer 260 has a thickness less than or equal to about 20 Å, or less than or equal to about 15 Å or less than or equal to about 10 Å or less than or equal to about 5 Å.

Referring to FIG. 4B, one or more embodiments of the disclosure are directed to stacks 200 comprising a substrate 220 having an oxide surface 222. A glue layer 260 is on the oxide surface 222. The glue layer of some embodiments comprises TiN with a thickness in the range of about 5 Å to about 30 Å. An amorphous silicon layer 240 is on the glue layer 260 and has a thickness in the range of about 5 Å to about 50 Å. A metal layer 280 is on the amorphous silicon layer 240 and comprises one or more of tungsten and molybdenum.

One or more embodiments of the disclosure are directed to methods of depositing a conformal doped amorphous silicon thin film as one or more of a glue layer, a fluorine diffusion barrier and/or a nucleation layer for metal deposition (e.g., ALD tungsten deposition). While tungsten deposition is referred to in many embodiments, those skilled in the art will understand that other metals (e.g., Mo) could be deposited by the disclosed process. The disclosure is not limited to ALD tungsten deposition, ALD deposition or tungsten deposition.

Figure 5:
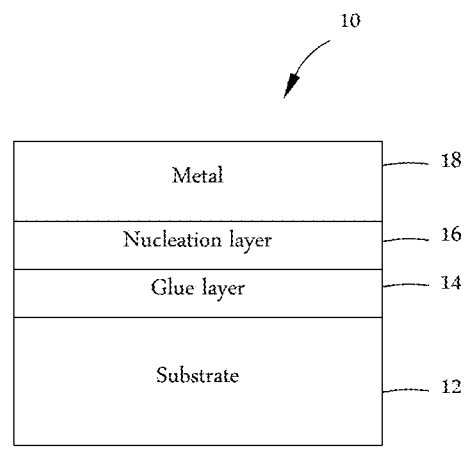
FIG. 5 shows schematic of a film stack in accordance with one or more embodiment of the disclosure.

Embodiments of the disclosure include process integration schemes for metal ALD processes. For example, tungsten deposited by atomic layer deposition on a silicon substrate. With reference to FIG. 5, a stack 10 may include a substrate 12 (e.g., $SiO_2$) with a glue layer 14 (e.g., TiN), a nucleation layer 16 (e.g., $WSi_x$ and $WB_x$) and a metal 18 (e.g., W). In one or more embodiment of a process scheme, a nucleation layer is replaced with a doped amorphous silicon layer. In some embodiments, the nucleation layer is replaced with a doped amorphous silicon layer and the TiN glue layer is made thinner. In one or more embodiments, both the nucleation layer and glue layer are replaced with a doped amorphous silicon layer.

Figures 6A, 6B:
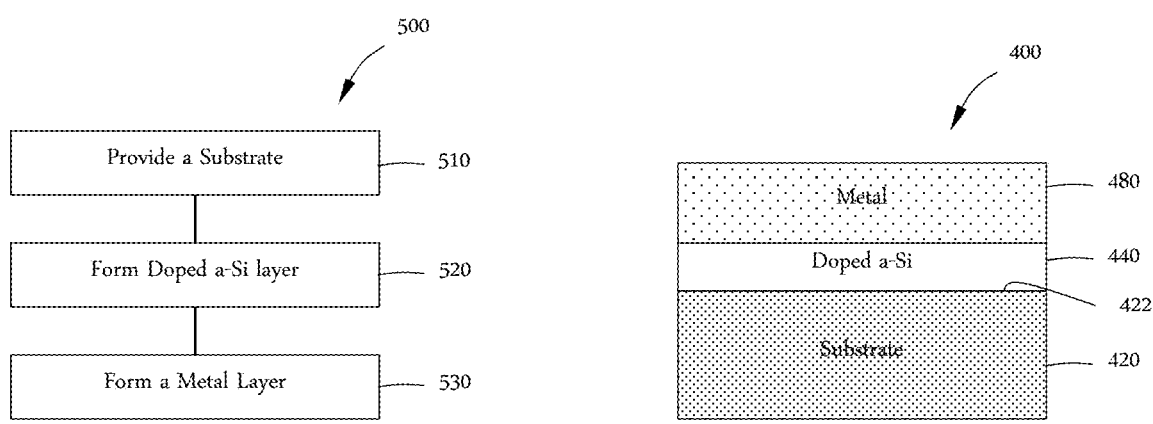
FIG. 6A shows a process scheme in accordance with one or more embodiment of the disclosure.
FIG. 6B shows a schematic of a film stack in accordance with the process scheme of FIG. 6A.

With reference to FIGS. 6A and 6B, one or more embodiments of the disclosure are directed processing methods 500 and film stacks 400. A substrate 420 having a substrate surface 422 is provided in step 510. In step 520, the substrate 420 exposed to a silicon precursor and a dopant to form a doped amorphous silicon layer 440 on the substrate surface 422.

Some embodiments of this disclosure advantageously provide methods of lowering deposition temperature of a nucleation layer by incorporating a dopant. In some embodiments, the morphology of a nucleation layer is modified by adding dopant during the conformal amorphous silicon layer deposition. In some embodiments, the deposition temperature of amorphous silicon can be reduced from greater than or equal to about 400° C. to less than or equal to about 100° C. or below. In some embodiments, tungsten film properties can be advantageously modified by changing dopant concentrations due to the different film properties/morphology of doped silicon films as compared to non-doped amorphous silicon films.

In some embodiments, the doped amorphous silicon (doped a-Si) formation can be achieved by maximizing the partial pressure of the silicon precursor while minimizing the wafer temperature. In some embodiments, the doped amorphous silicon is deposited using a CVD deposition process where the silicon precursor and the dopant are exposed to the substrate simultaneously.

Suitable silicon precursors include, but are not limited to, polysilanes ($Si_zH_a$) and halosilanes ($Si_zH_aX_b$). For example, polysilanes include silane, disilane ($Si_2H_6$), trisilane ($Si_3H_8$), tetrasilane ($Si_4H_{10}$), isotetrasilane, neopentasilane ($Si_5H_{12}$), cyclopentasilane ($Si_5H_{10}$), hexasilane ($C_6H_{14}$), cyclohexasilane ($Si_6H_{12}$) or, in general, $Si_zH_a$ where z=1 or more, and combinations thereof. For example, disilane, which has a moderate processing temperature and high vapor pressure, may be used as the silicon precursor alone or in combination with other species.

For example, halosilanes include dihalosilane ($SiH_2X_2$), trihalosilane ($SiHX_3$), tetrahalosilane ($SiX_4$), or hexahalodisilane ($Si_2X_6$) or, in general, $Si_zH_aX_b$ where z=1 or more X is a halogen and b=1 or more, and combinations thereof. In some embodiments, the halogen present in the halosilane is independently selected from fluorine, chlorine, bromine or iodine. In some embodiments, the halogen consists essentially of chlorine.

In some embodiments, the silicon precursor comprises substantially only disilane. In some embodiments, the silicon precursor comprises substantially only dichlorosilane. As used in this specification and the appended claims, the phrase "substantially only" means that at least 95% of the active species is the stated species. Other gases, such as carrier gases and inert gases, can be included in any amount.

The dopant may be any material suitable for doping the deposited amorphous silicon layer. In some embodiments, the doped amorphous silicon layer comprises one or more of boron, phosphorous, arsenic or germanium. In some embodiments, the dopant comprises one or more of borane, diborane, phosphine, diphosphine, arsine, diarsine, germane or digermane. In some embodiments, the dopant comprises substantially only diborane. In some embodiments, the dopant comprises substantially only diphosphine. In some embodiments, the dopant comprises substantially only diarsine. In some embodiments, the dopant comprises substantially only digermane.

The thickness of the doped amorphous silicon layer 440 can vary depending on, for example, the substrate surface and subsequent films and processes. In some embodiments, the doped amorphous silicon layer 440 has a thickness greater than or equal to about 20 Å. In one or more embodiments, the doped amorphous silicon layer 440 has a thickness in the range of about 1 Å to about 200 Å, or in the range of about 10 Å to about 150 Å, or in the range of about 20 Å to about 100 Å, or in the range of about 40 Å to about 100 Å. In some embodiments, the doped amorphous silicon layer 440 has a thickness in the range of about 10 Å to about 50 Å. In some embodiments, the thickness of the doped amorphous silicon layer 440 is greater than 0 Å and less than or equal to about 100 Å, 75 Å, 50 Å, 45 Å or 40 Å. In some embodiments, the doped amorphous silicon layer 440 has a minimum thickness sufficient to form a continuous layer. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In some embodiments, the doped amorphous silicon layer 440 forms conformally on the substrate 420. As used herein, the term "conformal", or "conformally", refers to a layer that adheres to and uniformly covers exposed surfaces with a thickness having a variation of less than 1% relative to the average thickness of the film. For example, a 100 Å thick film would have less than 1 Å variations in thickness. This thickness and variation includes edges, corners, sides, and the bottom of recesses. For example, a conformal layer deposited in various embodiments of the disclosure would provide coverage over the deposited region of essentially uniform thickness on complex surfaces.

A metal layer 480 is formed on the doped amorphous silicon layer 440 in step 530. The metal layer 480 can be formed by any suitable technique including, but not limited to, atomic layer deposition (ALD), plasma-enhanced atomic layer deposition (PE-ALD), chemical vapor deposition (CVD), plasma-enhanced chemical vapor deposition (PE-CVD) and physical vapor deposition (PVD).

The metal layer 480 can comprise any suitable metal. In some embodiments, the metal layer 480 comprises one or more of tungsten or molybdenum. In some embodiments, the metal layer 480 consists essentially of tungsten. In some embodiments, the metal layer 480 consists essentially of molybdenum. As used in this regard, "consists essentially of" means that the metal layer 480 is greater than or equal to about 80, 85, 90 or 95 atomic % of the specified component. For example, a metal layer 480 consisting essentially of tungsten has a composition that is greater than or equal to about, for example, 90 atomic % tungsten.

In some embodiments, the metal layer 480 is deposited by CVD. A metal precursor and a reactant may be coflowed into a processing chamber to deposit a layer on the substrate. The precursor and reactant are allowed to react in the gas phase.

In some embodiments, the metal layer 480 is deposited by ALD. In some embodiments, the metal layer 480 is deposited by sequentially exposing the doped amorphous silicon layer 440 to a metal precursor and a reactant.

The metal precursor can be any suitable precursor that can be used to deposit a metal film. In some embodiments, the metal precursor comprises a metal selected from tungsten, molybdenum and combinations thereof. In one or more embodiments, the metal precursor comprises one or more of $WF_6$ and $MoF_6$. In some embodiments, the metal precursor is a fluorine containing precursor. It is known that fluorine may etch silicon surface. Some embodiments of the disclosure advantageously allow the use of fluorine precursors because the doped amorphous silicon layer 240 can be formed to a thickness sufficient to ensure that the precursor does not remove all of the doped amorphous silicon film.

The reactant can be any suitable reactant that is able to react with a species formed on the surface. For example, in an ALD process, if $WF_6$ is used as the precursor, there will be $-WF_x$ species on the surface. The reactant is able to react with the $-WF_x$ species to produce a W film.

Figure 7:
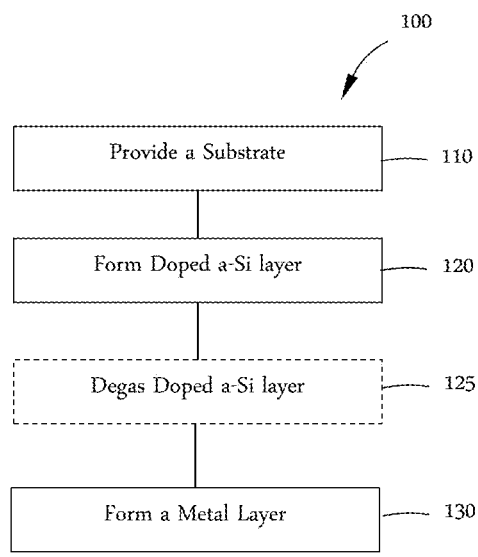
FIG. 7 shows a process scheme in accordance with one or more embodiment of the disclosure.

FIG. 7 shows a process flow for another embodiment of the disclosure in which a degas process 125 is included after formation of the doped amorphous silicon layer 440. The doped amorphous silicon layer 440 in some embodiments is exposed to a degas environment to remove outgassed species prior to forming the metal layer 480.

The deposited doped amorphous silicon layer 440 may evolve or outgas a species, for example, hydrogen. The degas environment provides an opportunity for the gaseous species to evolve, minimizing bubbling of the final film. The degas environment can include any condition with allows or encourages degassing of the film. For example, the degas environment may consists essentially of an inert gas. As used in this regard, "consists essentially of" means that there is no gaseous species that interfere with the outgassing of the deposited film. Other reactive species may be present without inhibiting degassing of the film while still consisting essentially of an inert gas.

Suitable inert gases include, but are not limited to, one or more of argon, helium, nitrogen, and/or mixtures thereof.

In one or more embodiments, the outgassed species comprises hydrogen, $SiH_2$, $SiH_3$, $SiH_4$, and/or other low-order silanes.

The pressure in the processing chamber, or region of the processing chamber can be independently controlled for the precursor exposure and degas environment. In some embodiments, exposure to each of the silicon precursor, dopant and the degas environment occurs at a pressure in the range of about 100 mTorr to about 600 Torr. In some embodiments, the silicon precursor and/or the dopant is exposed to the substrate at a pressure greater than or equal to about 500 mTorr, or greater than or equal to about 1 Torr, or greater than or equal to about 5 Torr, or greater than or equal to about 10 Torr, or greater than or equal to about 20 Torr, or greater than or equal to about 30 Torr.

The temperature at which the substrate surface is exposed to the silicon precursor, dopant and/or degas environment can be varied depending on, for example, the thermal budget of the device being formed and the silicon precursor and/or dopant. In some embodiments, exposure to each of the silicon precursor, the dopant and/or the degas environment occurs at a temperature in the range of about 25° C. to about 700° C. In one or more embodiments, the doped amorphous silicon layer 440 is formed at a temperature in the range of about 25° C. to about 700° C., or in the range of about 50° C. to about 600° C., or in the range of about 100° C. to about 550° C. In some embodiments, the doped amorphous silicon layer 440 is formed at a temperature greater than or equal to about 25° C. and less than or equal to about 550° C., less than or equal to about 400° C., less than or equal to about 250° C., less than or equal to about 200° C., or less than or equal to about 100° C.

The thickness of the doped amorphous silicon layer 440 formed with the silicon precursor and the dopant before exposure to the degas environment can be modified. In some embodiments, each exposure to the silicon precursor, the dopant and the degas environment grows a film with a thickness in the range of about 5 Å to about 20 Å, or about 20 Å to about 100 Å, or about 40 Å to about 100 Å.

The precursor, dopant and degas environments can be repeatedly sequentially exposed to the substrate surface to form a film with a predetermined thickness. In some embodiments, the amorphous silicon film has a total thickness in the range of about 20 Å to about 1 µm.

Figures 8A, 8B:
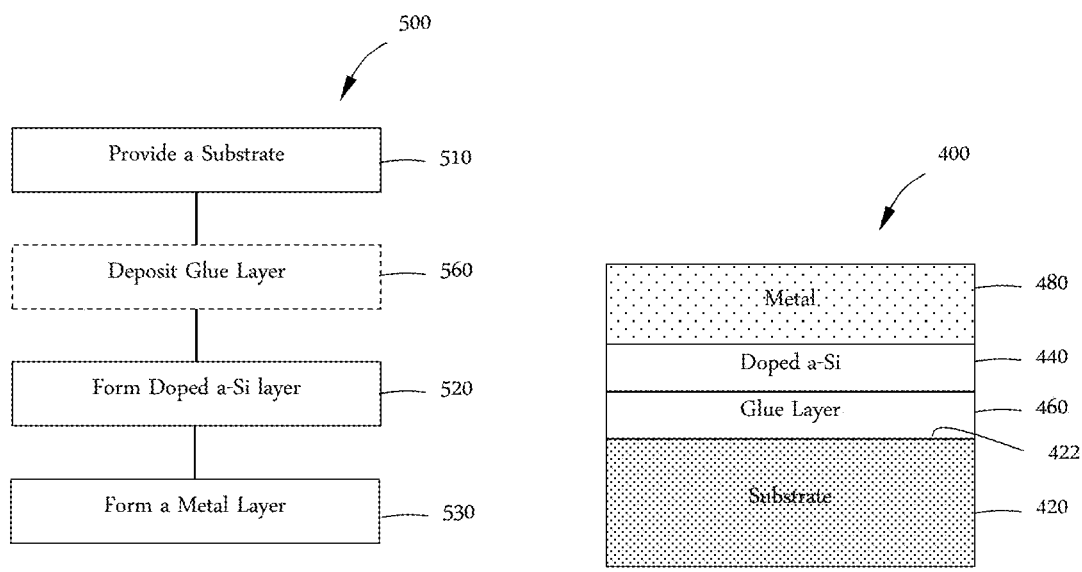
FIG. 8A shows a process scheme in accordance with one or more embodiment of the disclosure.
FIG. 8B shows a schematic of a film stack in accordance with the process scheme of FIG. 8A.

Referring to FIGS. 8A and 8B, some embodiments of the disclosure further comprise step 560 in which a glue layer 460 is deposited on the substrate before forming the doped amorphous silicon layer 440. The glue layer 460 is a layer that the doped amorphous silicon can stick to with less likelihood of peeling than if the doped amorphous silicon layer was deposited directly onto the substrate 420. In some embodiments, the glue layer comprises TiN. In one or more embodiments, the substrate 420 has a silicon oxide surface and the glue layer comprises TiN.

The thickness of the glue layer 460 can vary depending on the substrate and the thickness of doped amorphous silicon to be deposited. In some embodiments, the glue layer 460 has a thickness in the range of about 1 Å to about 30 Å, or in the range of about 5 Å to about 30 Å. In some embodiments, the glue layer 460 has a thickness less than or equal to about 20 Å, or less than or equal to about 15 Å or less than or equal to about 10 Å or less than or equal to about 5 Å.

Referring to FIG. 8B, one or more embodiments of the disclosure are directed to stacks 400 comprising a substrate 420 having an oxide surface 422. A glue layer 460 is on the oxide surface 422. The glue layer of some embodiments comprises TiN with a thickness in the range of about 5 Å to about 30 Å. A doped amorphous silicon layer 440 is on the glue layer 460 and has a thickness in the range of about 5 Å to about 50 Å. A metal layer 480 is on the doped amorphous silicon layer 440 and comprises one or more of tungsten and molybdenum.

One or more embodiments of the disclosure are directed to methods of depositing a metal layer on a thin film comprising one or more of boron or silicon as one or more of a glue layer, a fluorine diffusion barrier and/or a nucleation layer without the use of a barrier layer. While the deposition of tungsten metal is referred to in many embodiments, those skilled in the art will understand that other metals (e.g., Mo) can be deposited by the disclosed processes. Additionally, the disclosure is not limited to metal deposition by ALD deposition or deposition of tungsten.

Some embodiments of this disclosure advantageously provide methods of depositing a metal layer on a substrate surface which is substantially free of a barrier layer. The relative absence of the battier layer allows for the formation of metal lines or structures which have relatively lower resistance than similar structures which contain a barrier layer. Without being bound by theory, it is believed that the absence of the barrier layer allows for a greater volume of metal deposition in the same volume and thereby a lower resistance of the metal bulk. In some embodiments, the metal layer is deposited as part of a metal stack. In some embodiments, a nucleation layer is formed directly on the substrate surface without a battier layer. In some embodiments, the nucleation layer comprises one or more of silicon or boron.

A skilled artisan will recognize that fluorine-containing compounds may etch certain surfaces (e.g., silicon surfaces). Some embodiments of the disclosure advantageously allow for the use of fluorine-containing metal precursors without a barrier layer. Without being bound by theory, it is believed that the nucleation layer 830 can be formed to a thickness sufficient to ensure that the metal precursor does not remove the entire nucleation layer and etch, or otherwise damage, the substrate surface.

In some embodiments, the metal precursor exposed to the nucleation layer comprises substantially no fluorine. Without being bound by theory, it is believed that by using metal precursors without fluorine, the effects of fluorine attack on the substrate surface can be minimized or eliminated.

Figure 9A:
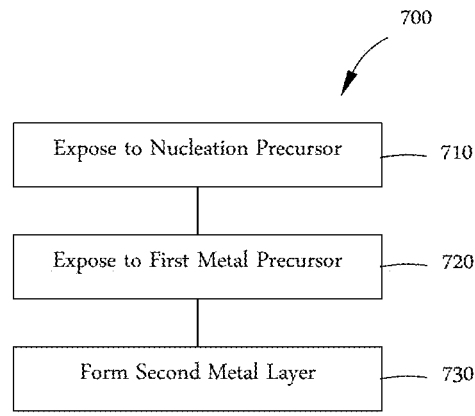
FIG. 9A shows a process scheme in accordance with one or more embodiment of the disclosure.
Figure 9B:
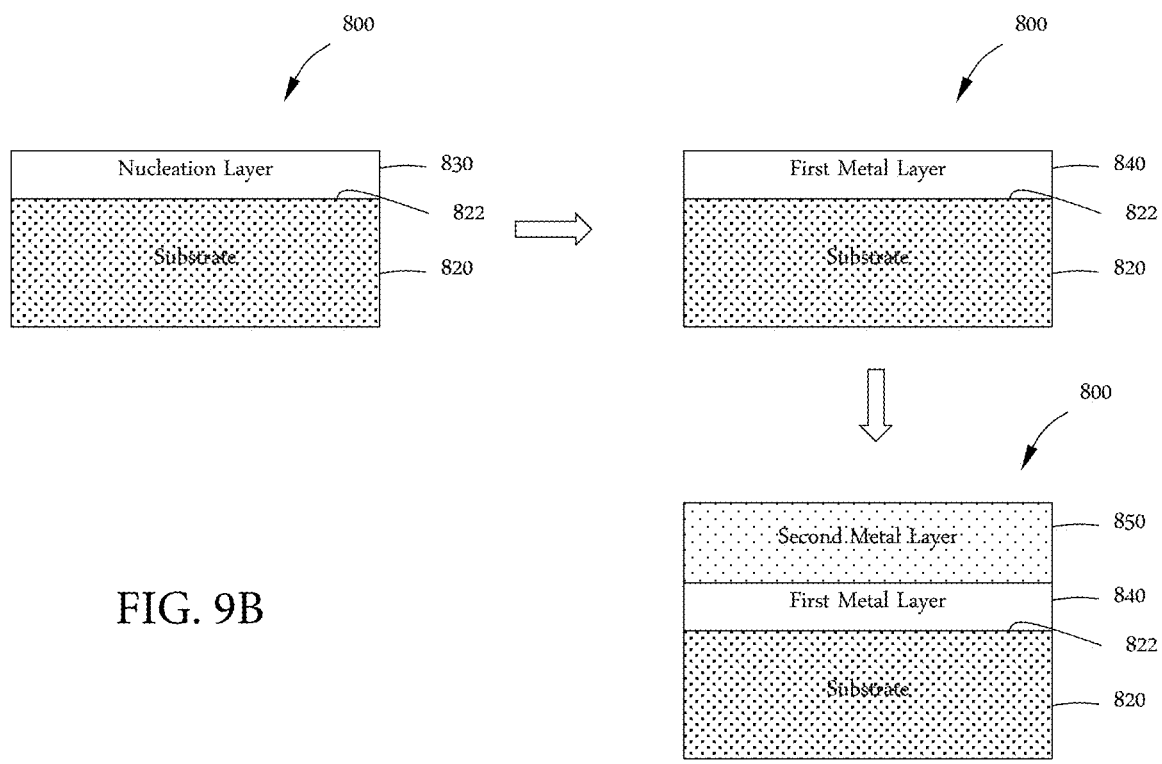
FIG. 9B shows a schematic of a film stack in accordance with the process scheme of FIG. 9A.

With reference to FIGS. 9A and 9B, one or more embodiments of the disclosure are directed processing methods 700 for forming film stacks 800. At 710, a substrate 820 having a substrate surface 822 is exposed to a nucleation precursor to form a nucleation layer 830. In some embodiments, the nucleation layer 830 is formed by thermal decomposition of the nucleation precursor.

In some embodiments, the substrate 820 comprises a dielectric. In some embodiments, the substrate 820 comprises one or more of silicon dioxide or aluminum oxide. In some embodiments, the substrate 820 consists essentially of silicon oxide or aluminum oxide. As used in this regard, "consists essentially of" means that the substrate comprises greater than 95%, 98%, 99% or 99.5% of the stated material on an atomic basis. A skilled artisan will recognize that the terms "silicon oxide" and "aluminum oxide" do not convey any specific atomic ratio. These materials may be either stoichiometric or non-stoichiometric.

In some embodiments, the substrate surface 822 is substantially free of a barrier layer. As used in this regard, "substantially free of a barrier layer" means that less than 5%, 2%, 1% or 0.5% of the substrate surface comprises a barrier layer. In some embodiments, the substrate surface 822 is substantially free of a barrier layer comprising one or more of TiN, TaN, SiN, TiSiN or SiCN.

In some embodiments, the nucleation precursor comprises a boron precursor and the nucleation layer is a boron layer. In some embodiments, the nucleation precursor consists essentially of a boron precursor. In some embodiments, the boron layer is an amorphous boron layer.

Suitable boron precursors include, but are not limited to, boranes, alkylboranes and haloboranes. In some embodiments, the boron precursor comprises one or more species with a general formula of $B_c H_d X_e R_f$, where each X is a halogen independently selected from F, Cl, Br and I, each R is an independently selected C1-C4 alkyl group, c is any integer greater than or equal to 2, each of d, e and f are less than or equal to c+2 and d+e+f is equal to c+2.

In some embodiments, the nucleation precursor comprises a silicon precursor and the nucleation layer is a silicon layer. In some embodiments, the nucleation precursor consists essentially of a silicon precursor. In some embodiments, the silicon layer is an amorphous silicon layer.

Suitable silicon precursors include, but are not limited to, polysilanes and halosilanes. In some embodiments, the silicon precursor comprises one or more species with a general formula of $Si_g H_h X_i$, where each X is a halogen independently selected from F, Cl, Br and I, g is any integer greater than or equal to 1, h and i are each less than or equal to 2g+2 and h+i is equal to 2g+2.

In some embodiments, the nucleation precursor comprises a silicon precursor and a boron precursor and the nucleation layer comprises silicon and boron. In some embodiments, the nucleation layer is amorphous. In some embodiments, the amorphous layer comprises no more than 5 atomic percent silicon. In some embodiments, the amorphous layer comprises no more than 5 atomic percent boron.

The thickness of the nucleation layer 830 can vary depending on, for example, the substrate surface 822 and subsequent films and processes. In some embodiments, the nucleation layer 830 has a thickness greater than or equal to about 20 Å. In one or more embodiments, the nucleation layer 830 has a thickness in the range of about 1 Å to about 200 Å, or in the range of about 10 Å to about 150 Å, or in the range of about 20 Å to about 100 Å, or in the range of about 40 Å to about 100 Å. In some embodiments, the nucleation layer 830 has a thickness in the range of about 10 Å to about 50 Å. In some embodiments, the thickness of the nucleation layer 830 is greater than 0 Å and less than or equal to about 100 Å, 75 Å, 50 Å, 45 Å or 40 Å.

In some embodiments, the nucleation layer 830 has a minimum thickness sufficient to form a continuous layer. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In some embodiments, the nucleation layer 830 forms conformally on the substrate surface 822. As used herein, the term "conformal", or "conformally", refers to a layer that adheres to and uniformly covers exposed surfaces with a thickness having a variation of less than 1% relative to the average thickness of the film. For example, a 100 Å thick film would have less than 1 Å variations in thickness. This thickness and variation includes edges, corners, sides, and the bottom of recesses. For example, a conformal layer deposited in various embodiments of the disclosure would provide coverage over the deposited region of essentially uniform thickness on complex surfaces.

At 720 the nucleation layer 830 is exposed to a first metal precursor to form a first metal layer 840. The first metal precursor comprises a first metal. In some embodiments, forming a first metal layer is performed by converting the nucleation layer to a first metal layer. In some embodiments, the conversion process involves substituting atoms of the nucleation layer with first metal atoms. In some embodiments, $H_2$ is added to as a co-reactant with the first metal precursor.

The first metal may be any suitable metal. In some embodiments, the first metal comprises tungsten or molybdenum. In some embodiments, the first metal precursor comprises one or more ligand selected from halides, carbonyls or cyclopentadienes. In some embodiments, the first metal precursor comprises or consists essentially of one or more of $WF_6$, $WCl_6$, $WCl_5$, $W(CO)_5$, $MoF_6$, $MoCl_5$, or $Mo(CO)_6$. In some embodiments, the first metal precursor consists essentially of $W(CO)_5$. As used in this regard, "consists essentially of" means that the first metal precursor comprises greater than 95%, 98%, 99% or 99.5% of the stated species.

In some embodiments, the first metal precursor comprises substantially no fluorine. As used in this regard, "comprises substantially no fluorine" means that the first metal precursor comprises less than 2%, 1%, 0.5% or 0.1% fluorine atoms on an atomic basis.

At 730, a second metal layer 850 is formed on the first metal layer 840 by exposing the substrate 820 to a second metal precursor. The second metal precursor comprises a second metal. The second metal may be any suitable metal. In some embodiments, the second metal comprises tungsten or molybdenum. In some embodiments, the second metal layer 850 consists essentially of tungsten. In some embodiments, the second metal layer 850 consists essentially of molybdenum. As used in this regard, "consists essentially of" means that the second metal layer 850 comprises greater than 95%, 98%, 99% or 99.5% of the specified element on an atomic basis. In some embodiments, the first metal precursor and second metal precursor comprise the same metal. In some embodiments, the first metal precursor and second metal precursor comprise different metals.

In some embodiments, the second metal precursor comprises one or more ligand selected from halides, carbonyls or cyclopentadienes. In some embodiments, the second metal precursor comprises or consists essentially of one or more of $WF_6$, $WCl_6$, $WCl_5$, $W(CO)_5$, $MoF_6$, $MoCl_5$, or $Mo(CO)_6$. In some embodiments, the second metal precursor consists essentially of $W(CO)_5$. As used in this regard, "consists essentially of" means that the first metal precursor comprises greater than 95%, 98%, 99% or 99.5% of the stated species.

The second metal layer 850 can be formed by any suitable technique including, but not limited to, atomic layer deposition (ALD), plasma-enhanced atomic layer deposition (PE-ALD), chemical vapor deposition (CVD), plasma-enhanced chemical vapor deposition (PE-CVD) and physical vapor deposition (PVD).

In some embodiments, the second metal layer 850 is formed by CVD. A second metal precursor and a reactant may be coflowed into a processing chamber to deposit a second metal layer 850 on the substrate 820. The second metal precursor and reactant are allowed to react in the gas phase.

In some embodiments, the second metal layer 850 is deposited by ALD. In some embodiments, the second metal layer is formed by separately exposing the substrate surface to a second tungsten precursor and a reactant.

The reactant can be any suitable reactant that is able to react with a species formed on the surface. For example, in an ALD process, if $WF_6$ is used as the precursor, there will be $-WF_x$ species on the surface. The reactant is able to react with the $-WF_x$ species to produce a W film. In some embodiments, the reactant comprises hydrogen gas ($H_2$) or nitrogen gas ($N_2$).

In some embodiments, an inert gas may be added to the processing chamber during processing. In some embodiments, an inert gas is added during formation of the first metal film 840. In some embodiments, an inert gas is added during formation of the second metal film 850. Inert gases may be flowed into the processing chamber with the first or second metal precursor or may be flowed separately. In some embodiments, an inert gas comprises one or more of Ar, He, or nitrogen gas ($N_2$).

The temperature at which the substrate surface is exposed to the nucleation precursor, first metal precursor and/or second metal precursor can be varied depending on, for example, the thermal budget of the device being formed and the precursors selected. In some embodiments, exposure to each of the precursors occurs at a temperature in the range of about 25° C. to about 700° C. In one or more embodiments, the substrate is exposed at a temperature in the range of about 25° C. to about 700° C., or in the range of about 50° C. to about 600° C., or in the range of about 100° C. to about 550° C. In some embodiments, the substrate is exposed at a temperature greater than or equal to about 25° C. and less than or equal to about 550° C., less than or equal to about 400° C., less than or equal to about 250° C., less than or equal to about 200° C., or less than or equal to about 100° C. In some embodiments, the nucleation layer 830 and the first metal film 840 are formed at a temperature in a range of about 300° C. to about 550° C., while the second metal film is formed at a temperature in a range of about 200° C. to about 550° C.

The pressure at which the substrate surface is exposed to the nucleation precursor, first metal precursor and/or second metal precursor can be varied depending on, for example, the precursors selected and other process conditions. In some embodiments, exposure to each of the precursors occurs at a pressure in the range of about 0.01 Torr to about 100 Torr. In one or more embodiments, the substrate is exposed at a pressure in the range of about 0.01 Torr to about 100 Torr, or in the range of about 0.1 Torr to about 80 Torr, or in the range of about 1 Torr to about 60 Torr. In some embodiments, the substrate is exposed at a pressure greater than or equal to about 1 Torr and less than or equal to about 100 Torr, less than or equal to about 80 Torr, less than or equal to about 60 Torr, less than or equal to about 40 Torr, or less than or equal to about 25 Torr. In some embodiments, the substrate is exposed at a pressure in a range of about 4 Torr to about 100 Torr.

One or more embodiment of the disclosure is directed to methods of depositing a high quality a-Si layer with lower hydrogen content. In some embodiments, the a-Si layer is deposited at a relatively high pressure and relatively high temperature. In some embodiments, deposition occurs at a pressure greater than or equal to about 200 Torr, greater than or equal to about 225 Torr, greater than or equal to about 250 Torr, greater than or equal to about 275 Torr, greater than or equal to about 300 Torr, greater than or equal to about 325 Torr, or greater than or equal to about 350 Torr. In some embodiments, the substrate surface is maintained at a temperature greater than or equal to about 450° C., greater than or equal to about 475° C., greater than or equal to about 500° C., greater than or equal to about 525° C., or greater than or equal to about 550° C.

The quality of the amorphous silicon film is determined based on the hydrogen content of the film, as measured by Rutherford Backscattering Spectrometry (RBS). In some embodiments, the hydrogen content of the a-Si layer is less than or equal to 6 atomic percent, less than or equal to 5 atomic percent, less than or equal to 4 atomic percent, less than or equal to 3 atomic percent, less than or equal to 2 atomic percent, less than or equal to 1 atomic percent, or less than or equal to 0.5 atomic percent.

According to some embodiments, the nucleation layer (i.e., the high quality amorphous silicon film) is converted to a metal (e.g., tungsten) film at low temperature to provide a film with less fluorine penetration (i.e., fluorine content) to reduce film peeling and decrease film resistivity. In some embodiments, the nucleation layer is exposed to the first metal precursor at a temperature of less than or equal to about 450° C., less than or equal to about 425° C., less than or equal to about 400° C., less than or equal to about 375° C., or less than or equal to about 350° C. In some embodiments, the nucleation layer is exposed to the first metal precursor at a temperature of greater than or equal to about 250° C., greater than or equal to about 275° C., greater than or equal to about 300° C., greater than or equal to about 325° C., or greater than or equal to about 350° C. In some embodiments, the nucleation layer is exposed to the first metal precursor at a temperature in the range of about 250° C. to about 450° C., or in the range of about 275° C. to about 425° C., or in the range of about 300° C. to about 400° C.

Without being bound by theory, it is believed that the relatively low fluorine penetration of some embodiments provides better film adhesion (e.g., less film peeling) and a lower resistivity for the resulting first metal film. In some embodiments, the fluorine concentration of the resulting first metal film is less than or equal to about $1 \times 10^{21}$ atoms/cm$^3$, less than or equal to about $7.5 \times 10^{20}$ atoms/cm$^3$, or less than or equal to about $5 \times 10^{20}$ atoms/cm$^3$, or less than or equal to about $2.5 \times 10^{20}$ atoms/cm$^3$, or less than or equal to about $1 \times 10^{20}$ atoms/cm$^3$. In some embodiments, the resistivity of a resulting first metal film with a thickness of about 20 nm is less than or equal to about 20 µΩ·cm, less than or equal to about 19 µΩ·cm, less than or equal to about 18 µΩ·cm, less than or equal to about 17 µΩ·cm, less than or equal to about 16 µΩ·cm, or less than or equal to about 15 µΩ·cm.

One or more embodiment of the disclosure is directed to methods of depositing a low-fluorine tungsten bulk film by atomic layer deposition with relatively larger tungsten grain size, as measured by x-ray diffraction (XRD). In some embodiments, the deposition of the low-fluorine bulk tungsten is performed by atomic layer deposition while the substrate is maintained at a temperature of greater than or equal to about 450° C., greater than or equal to about 475° C., greater than or equal to about 500° C., or greater than or equal to about 525° C.

The inventors have found that the grain size of the low-fluorine bulk tungsten film is directly proportional to the temperature at which the film is deposited. For example, higher deposition temperatures will form films with higher grain sizes. Without being bound by theory, it is believed that smaller tungsten grains cause electron scattering. In some embodiments, the average grain size of the low-fluorine bulk tungsten is greater than or equal to about 110 Å, greater than or equal to about 115 Å, greater than or equal to about 120 Å, greater than or equal to about 122 Å, greater than or equal to about 124 Å, greater than or equal to about 126 Å, or greater than or equal to about 128 Å, or greater than or equal to about 130 Å. The grain size of a low-fluorine bulk tungsten film formed at low temperature (i.e., 300-400° C.) is less than 110 Å.

The inventors have found that the resistivity of the low-fluorine bulk tungsten film is increased by greater than or equal to about 0.5 µΩ·cm, greater than or equal to about 0.75 µΩ·cm, or greater than or equal to about 1.0 µQΩ·cm for every 10° C. below 500° C. that the deposition of the low-fluorine bulk tungsten is performed. For example, if a low-fluorine bulk tungsten film deposited at 500° C. has a resistivity of 15 µΩ·cm. a similar film deposited at 480° C. may have a resistivity of greater than or equal to 17 µΩ·cm.

According to one or more embodiments, the substrate is subjected to processing prior to and/or after processing according to the disclosure. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura® both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The inventors have surprisingly found that the performance of the disclosed methods without an air break between process steps provides metal films with improved properties relative to films produced by methods which involve an air break. In some embodiments, the improved property is selected from one or more of resistivity, roughness, adhesion, stress, thickness uniformity and roughness uniformity.

For the purposes of this disclosure, an "in-situ" process is performed without an intervening air break. Stated differently, the substrate is maintained under load lock conditions and is not exposed to ambient air during the processing method.

Similarly, an "ex-situ" process is performed with an intervening air break or exposure to the ambient atmosphere during processing. In some embodiments, an ex-situ process is interrupted with an air break between process steps. For example, an ex-situ process may expose the substrate to an ambient atmosphere after formation of the amorphous nucleation layer at 710, but before exposure to the first metal precursor at 720.

The in-situ processes of some embodiments may be performed on a cluster tool or similar multi-stage or multi-substrate processing tool. Exemplary cluster tools which may be adapted for the present disclosure include, but are not limited to, Endura®, Centura®, and Olympia™, all available from Applied Materials, Inc., of Santa Clara, Calif.

Figure 10:
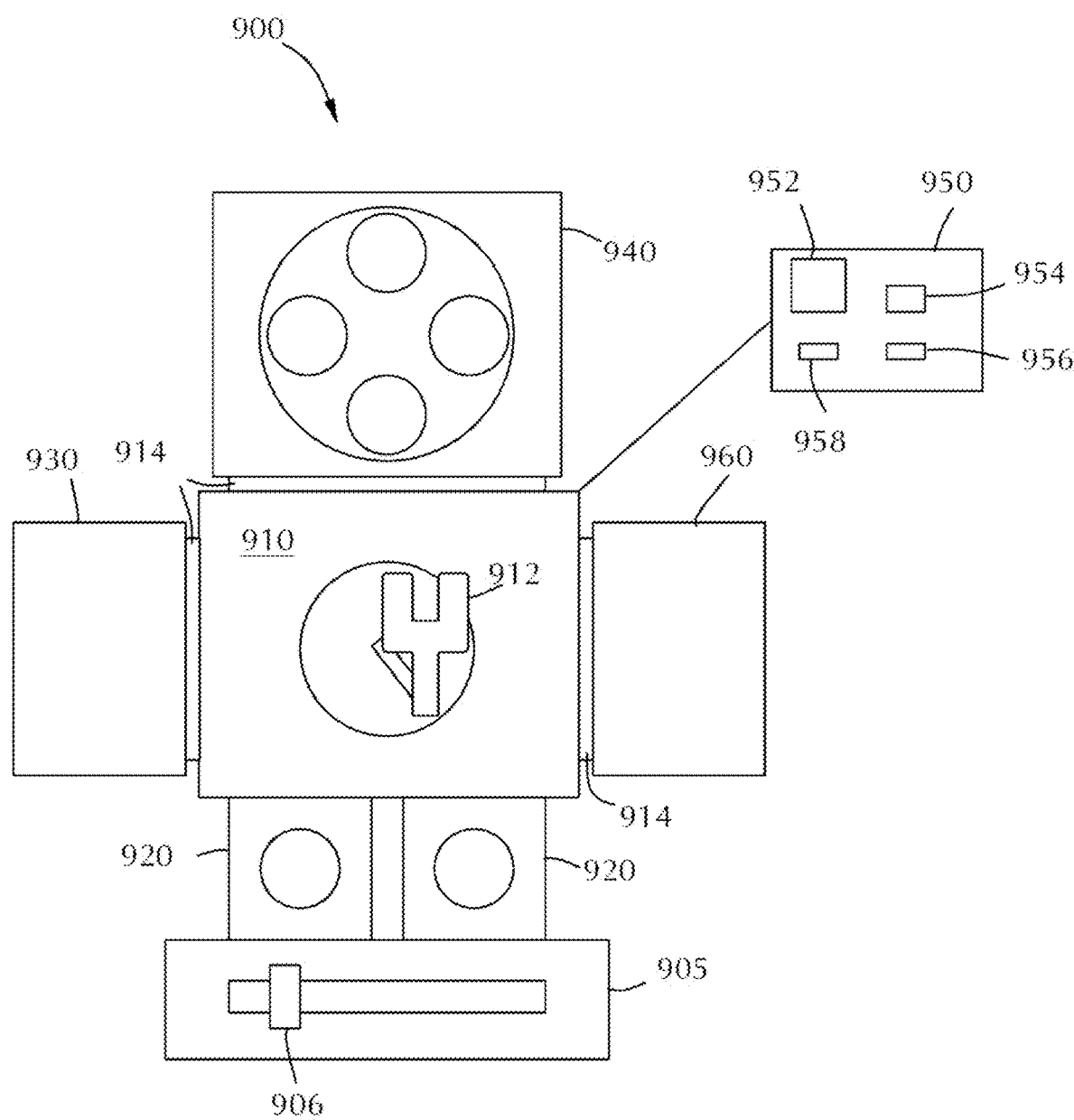
FIG. 10 shows a processing system for performing in-situ methods in accordance with one or more embodiments of the disclosure.

With reference to FIG. 10, additional embodiments of the disclosure are directed to a processing system 900 for executing the in-situ processes described herein. FIG. 10 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 10, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as a nucleation layer deposition chamber and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 comprises a first metal conversion chamber and is fluid communication with one or more reactive gas sources to provide flows of reactive gas to the processing chamber 940 to perform the first metal conversion process. The substrate can be moved to and from the processing chamber 940 by robot 912 passing through isolation valve 914.

Processing chamber 945 can also be connected to the central transfer station 910. In some embodiments, the processing chamber 945 is the same type of processing chamber 940 configured to perform the same process as processing chamber 940. This arrangement might be useful where the process occurring in processing chamber 940 takes much longer than the process in processing chamber 930.

In some embodiments, processing chamber 960 is connected to the central transfer station 910 and is configured to act as a second metal layer deposition chamber. The processing chamber 960 can be configured to perform one or more different CVD or ALD processes.

In some embodiments, each of the processing chambers 930, 940, 945 and 960 are configured to perform different portions of the disclosed processing methods. For example, processing chamber 930 may be configured to perform the nucleation layer formation process, processing chamber 940 may be configured to perform the first metal conversion process, processing chamber 945 may be configured as a metrology station or to perform the first metal conversion process and processing chamber 960 may be configured to perform a second metal deposition process. The skilled artisan will recognize that the number and arrangement of individual processing chamber on the tool can be varied and that the embodiment illustrated in FIG. 10 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, 945, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and subprocessors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to form a nucleation layer; a configuration to convert the nucleation layer to a first metal layer; and/or a configuration to deposit a second metal layer.

EXAMPLES

For each of the following examples, samples were prepared by depositing a tungsten layer on an amorphous tungsten layer. The amorphous tungsten layer was formed by conversion of an amorphous silicon layer.

A nucleation layer comprising amorphous silicon (a-Si) was formed on the surface of a substrate by exposing the substrate surface to a nucleation precursor comprising disilane. The thickness of the nucleation layer was in a range of about 15 Å to about 35 Å. The substrate surface was substantially free of a barrier layer before exposure to the nucleation precursor. The nucleation layer was exposed to $WF_6$ with a partial pressure in a range of about 0.1 Torr to about 0.5 Torr to convert the nucleation layer to a first metal layer comprising amorphous tungsten (a-W). A second metal layer was formed on the first metal layer by atomic layer deposition using $WF_6$ and $H_2$.

EXAMPLE 1

Samples were prepared as identified above. Some samples were processed "in-situ" without an air break. Other samples were processed "ex-situ" with an air break after the formation of the nucleation layer but before formation of the first metal layer.

Samples prepared ex-situ showed a resistivity for the second metal layer of about 30 μΩ·cm at 200 Å. Samples prepared in-situ showed a resistivity for the second metal layer of about 17 μΩ·cm at 200 Å.

Images were taken of the samples. The image of the in-situ sample is shown in FIG. 11A, while the image of the ex-situ sample is shown in FIG. 11B. The darker layer of these images is the first metal layer. The images show that the samples processed in-situ have better film continuity of the first metal layer than samples processed ex-situ.

A film adhesion test was also performed on these samples. A piece of tape was placed in contact with the samples and removed. A passing result shows no film removed from the sample by the tape when removed. The images of the tapes resulting from the adhesion tests are shown in FIG. 11C. As shown in the images, the samples processed in-situ demonstrated better adhesion (less film removed by the tape) than the samples processed ex-situ.

EXAMPLE 2

Samples were also prepared on CVD OX and 1K OX substrates. The CVD OX substrates were prepared by exposing a silicon substrate to a CVD process to deposit a layer of silicon oxide. A layer of aluminum oxide was deposited on the silicon oxide and the substrate was spike annealed before further processing.

The 1K OX substrates were prepared by thermally oxidizing a silicon substrate in a furnace to form a layer of silicon oxide with a thickness of about 1,000 Å. An aluminum oxide layer was deposited on the silicon oxide layer. The substrate was not annealed before further processing.

The substrates were further processed to prepare samples as identified above. Some samples were processed "in-situ" without an air break. Other samples were processed "ex-situ" with an air break after the formation of the first metal layer but before formation of the second metal layer.

The second metal layer of the samples was evaluated for resistivity at 200 Å, stress, resistance non-uniformity, and thickness non-uniformity. The results are presented in Table 1.

TABLE 1

|  | CVD OX | | 1K OX | |
| --- | --- | --- | --- | --- |
|  | In-Situ | Ex-Situ | In-Situ | Ex-Situ |
| Res (μΩ · cm) | 13.65 | 13.98 | 13.58 | 13.84 |
| Stress (MPa) | −892 | −490 | −761 | −657 |
| Rs N/U (3σ %) | 1.91 | 4.84 | 4.12 | 4.86 |
| Thk N/U (3σ %) | 4.93 | 6.80 | 6.52 | 10.13 |

These measurements indicate that a film of similar thickness has a lower resistivity when processed in-situ rather than ex-situ. Also, samples processed in-situ showed more compressive stress. Further, samples processed in-situ also showed a second metal layer with more uniform sheet resistance and thickness across the substrate surface.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
    exposing a substrate surface to a boron precursor to form an amorphous boron layer, the substrate surface being substantially free of a barrier layer;
    exposing the amorphous boron layer to a first metal precursor to convert the amorphous boron layer to a first metal layer; and
    forming a second metal layer on the first metal layer by exposing the first metal layer to a second metal precursor,
    wherein the processing method is performed without exposing the substrate surface to an air break.

2. The method of claim 1, wherein the method provides a first metal layer with improved resistivity, continuity, or adhesion relative to a similar processing method comprising exposing the substrate surface to air break.

3. The method of claim 1, wherein the method provides a second metal layer with improved resistivity, stress, thickness uniformity and/or resistance uniformity.

4. The method of claim 1, wherein the first metal precursor and the second metal precursor independently comprise one or more of $WF_6$, $WCl_6$, $W(CO)_5$, $MoF_6$, $MoCl_5$, or $Mo(CO)_6$.

5. The method of claim 1, wherein the first metal precursor consists essentially of $W(CO)_5$.

6. The method of claim 1, wherein the first metal precursor comprises substantially no fluorine.

7. The method of claim 1, wherein the first metal precursor and the second metal precursor comprise the same metal.

8. A processing method comprising:
    exposing a substrate surface to a silicon precursor to form an amorphous silicon layer, the substrate surface being substantially free of a barrier layer;
    exposing the amorphous silicon layer to a first metal precursor to convert the amorphous silicon layer to a first metal layer; and
    forming a second metal layer on the first metal layer by exposing the first metal layer to a second metal precursor,
    wherein the processing method is performed without exposing the substrate surface to an air break.

9. The method of claim 8, wherein the method provides a first metal layer with improved resistivity, continuity, or adhesion relative to a similar processing method comprising exposing the substrate surface to air break.

10. The method of claim 8, wherein the method provides a second metal layer with improved resistivity, stress, thickness uniformity and/or resistance uniformity.

11. The method of claim 8, wherein the silicon precursor comprises one or more species with a general formula of $Si_gH_hX_i$, where each X is a halogen independently selected from F, Cl, Br and I, g is any integer greater than or equal to 1, h and i are each less than or equal to 2 g+2 and h+i is equal to 2 g+2.

12. The method of claim 8, wherein the first metal precursor and the second metal precursor independently comprise one or more of $WF_6$, $WCl_6$, $W(CO)_5$, $MoF_6$, $MoCl_5$, or $Mo(CO)_6$.

13. The method of claim 8, wherein the first metal precursor consists essentially of $W(CO)_5$.

14. The method of claim 8, wherein the first metal precursor comprises substantially no fluorine.

15. The method of claim 8, wherein the first metal precursor and the second metal precursor comprise the same metal.

16. A processing method comprising:
exposing a substrate surface to a silicon precursor and a boron precursor to form an amorphous layer comprising silicon and boron, the substrate surface being substantially free of a barrier layer;
exposing the amorphous layer to a first metal precursor to convert the amorphous layer to a first metal layer; and
forming a second metal layer on the first metal layer by exposing the first metal layer to a second metal precursor,
wherein the processing method is performed without exposing the substrate surface to an air break.

17. The method of claim 16, wherein the method provides a first metal layer with improved resistivity, continuity, or adhesion relative to a similar processing method comprising exposing the substrate surface to air break.

18. The method of claim 16, wherein the method provides a second metal layer with improved resistivity, stress, thickness uniformity and/or resistance uniformity.

19. The method of claim 16, wherein the amorphous layer comprises no more than 5 atomic percent silicon or no more than 5 atomic percent boron.

20. The method of claim 16, wherein the first metal precursor and the second metal precursor independently comprise one or more of $WF_6$, $WCl_6$, $W(CO)_5$, $MoF_6$, $MoCl_5$, or $Mo(CO)_6$.

* * * * *